(12) United States Patent
Steeneken et al.

(10) Patent No.: US 8,493,157 B2
(45) Date of Patent: Jul. 23, 2013

(54) MEMS RESONATOR FOR FILTERING AND MIXING

(75) Inventors: Peter Gerard Steeneken, Valkenswaard (NL); Jozef T. M. Van Beek, Rosmalen (NL); Klaus Reimann, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/999,716

(22) PCT Filed: Jun. 18, 2009

(86) PCT No.: PCT/IB2009/052614
§ 371 (c)(1),
(2), (4) Date: Dec. 17, 2010

(87) PCT Pub. No.: WO2009/153754
PCT Pub. Date: Dec. 23, 2009

(65) Prior Publication Data
US 2011/0102095 A1 May 5, 2011

(30) Foreign Application Priority Data

Jun. 18, 2008 (EP) ..................... 08104460

(51) Int. Cl.
*H03H 9/46* (2006.01)
*H01L 41/107* (2006.01)

(52) U.S. Cl.
USPC ........... 331/154; 310/365; 333/186; 333/197; 455/323

(58) Field of Classification Search
USPC .......... 331/116 M, 116 R, 154, 155; 310/311, 310/314, 321, 322, 365, 368; 333/186, 197, 333/199; 455/293, 323
See application file for complete search history.

(56) References Cited

U.S. PATENT DOCUMENTS

| | | | | |
|---|---|---|---|---|
| 3,624,564 A | * | 11/1971 | Ise et al. | 333/189 |
| 4,553,060 A | * | 11/1985 | Domino et al. | 310/333 |
| 5,165,289 A | * | 11/1992 | Tilmans | 73/862.59 |
| 5,281,888 A | * | 1/1994 | Takeuchi et al. | 310/366 |
| 5,504,388 A | * | 4/1996 | Kimura et al. | 310/363 |

(Continued)

FOREIGN PATENT DOCUMENTS

CN 1179020 A 4/1998
WO 01/82467 A2 11/2001

OTHER PUBLICATIONS

Driscoll, M. "Phase Noise Performance of Analog Frequency Dividers," IEEE Trans. on Ultrasonics, Ferroelectrics, and Frequency Control, vol. 37, No. 4, pp. 295-301 (Jul. 1990).

(Continued)

*Primary Examiner* — Levi Gannon

(57) ABSTRACT

A method of operating a micro-electromechanical system, comprising a resonator; an actuation electrode; and a first detection electrode, to filter and mix a plurality of signals. The method comprises applying a first alternating voltage signal to the actuation electrode, wherein an actuation force is generated having a frequency bandwidth that is greater than and includes a resonant bandwidth of a mechanical frequency response of the resonator, and wherein a displacement of the resonator is produced which is filtered by the mechanical frequency response and varies a value of an electrical characteristic of the first detection electrode. The method also comprises applying a second alternating voltage signal to the first detection electrode, wherein the second voltage signal is mixed with the varying value to produce a first alternating current signal. The first alternating current signal is detected at the first detection electrode.

20 Claims, 10 Drawing Sheets

U.S. PATENT DOCUMENTS

| | | | | |
|---|---|---|---|---|
| 5,640,133 | A * | 6/1997 | MacDonald et al. | 333/197 |
| 5,839,062 | A | 11/1998 | Nguyen et al. | |
| 5,890,060 | A | 3/1999 | Kashima | |
| 6,566,786 | B2 * | 5/2003 | Nguyen | 310/309 |
| 6,763,340 | B1 | 7/2004 | Burns et al. | |
| 6,819,103 | B2 * | 11/2004 | Champion et al. | 324/260 |
| 6,909,221 | B2 * | 6/2005 | Ayazi et al. | 310/321 |
| 7,211,926 | B2 * | 5/2007 | Quevy et a | 310/315 |
| 2002/0176515 | A1 | 11/2002 | Boutigny et al. | |
| 2003/0184413 | A1 | 10/2003 | Nguyen | |
| 2004/0135714 | A1 | 7/2004 | Kuttner et al. | |

OTHER PUBLICATIONS

Abidi, Asad A., "Direct-Conversion Radio Transceivers for Digital Communications", IEEE J. of Solid-State Circuits, vol. 30, No. 12, pp. 1399-1410 (Dec. 1995).

Wong, A., et al. "Micromechanical Mixer-Filters ('Mixlers')", J. of Microelectromechanical Systems, vol. 13, No. 1, 14 pages (Feb. 2004).

Alastalo, A., et al, "A Micromechanical Resonating RF Mixer," $34^{th}$ European Microwave Conference, pp. 1297-1300 (Oct. 2004).

Chen, F., et al "CMOS-MEMS Resonant RF Mixer-Filters," $18^{th}$ IEEE Int'l. Conf. on Micro Electro Mechanical Systems, pp. 24-27 (Jan. 2005).

Li, S., et al. "Small Percent Bandwidth Design of a 423-MHz Notch-Coupled Micromechanical Mixler," IEEE Ultrasonics Symposium, pp. 1295-1298 (Sep. 2005).

International Search Report and Written Opinion for Int'l. patent appln. No. PCT/IB2009/052614 (Apr. 7, 2010).

* cited by examiner

MEMS RESONATOR FOR FILTERING AND MIXING

This invention relates to micro-electromechanical systems (MEMS). In particular, it relates to MEMS resonator devices, which can be used to perform filtering and mixing operations on a plurality of signals.

MEMS resonator devices typically comprise a resonator and means for both exciting vibration of the resonator and detecting the resulting displacement. The resonator itself is usually a thin disk or plate of semiconductor suspended above a substrate. The mechanical properties of the resonator are such that, when excited by an actuating force, it will tend to vibrate in one of a number of resonant modes.

In most applications of MEMS resonators, transducers are provided which convert electrical energy into mechanical (acoustic) vibration of the resonator and back again into detected electrical energy. Electrostatic (capacitive) actuation electrodes are most commonly used as the input transducer. For an electrostatic electrode, a charge on the electrode exerts electrostatic force on the closely-spaced resonator.

The output transducer or detection electrode may also be electrostatic. Here, the movement of the resonator (in response to the actuation signal) causes a change in the dimensions of a gap between the output electrode and the resonator. This, in turn, varies the capacitance of the resonator-electrode system, to produce a measurable variation in the detected output signal.

Current MEMS resonators have sizes that are sufficiently small to make Radio-Frequency (RF) resonators realizable using this technology. This makes MEMS technology an exciting prospect for next generation wireless communication devices.

In conventional electrostatic MEMS resonators, a Direct Current (DC) bias voltage is usually applied in addition to the electrical input actuation signal, to produce an electrostatic force $f_{elst}$ with the same frequency $\omega_{act}$ as the electrical input frequency:

$$F_{elst} \propto \alpha V_{act}^2 \qquad \text{(Equation 1)}$$

$$V_{act} = V_{bias,act} + V_{ac,act}\sin\omega_{act}t$$

$$F_{elst} \propto \alpha \left( \begin{array}{c} V_{bias,act}^2 + 2V_{bias,act}V_{ac,act}\sin\omega_{act}t + \\ \dfrac{V_{ac,act}^2}{2}(1 - \cos2\omega_{act}t) \end{array} \right)$$

The constant $\alpha$ depends on the type and geometry of the electrostatic actuator.

The resonator mechanically vibrates at the frequency of $F_{elst}$. The resonance is usually detected by applying a DC voltage $V_{bias,sense}$ across a detection gap or by measuring the electrical impedance. The size of this gap changes as a result of the motion of the resonator, changing its capacitance. The charge on the capacitor $Q=CV_{bias,sense}$ changes and an output current is generated at frequency $\omega_{act}$. Usually $V_{bias,act}=V_{bias,sense}$ is used.

A disadvantage of this method is the need for an extra DC voltage source $V_{bias,act}$ which must be stable and low noise. The required voltages can be relatively high, leading to increased power consumption.

It is also known to actuate a resonator with two Alternating Current (AC) input signals. This has been described in Wong and Nguyen, "Micromechanical Mixer-Filters ("Mixlers")", Journal of Microelectromechanical Systems, Vol. 13, No. 1, pages 100-112, February 2004. In this case, an AC actuation signal with two frequency components will result in mixing of the two components, because the electrostatic force is proportional to the square of the input voltage:

$$F_{elst} \propto \alpha V_{act}^2 \qquad \text{(Equation 2)}$$

$$V_{act} = V_{ac,1}\sin\omega_1 t + V_{ac,2}\sin\omega_2 t$$

$$F_{elst} \propto \dfrac{\alpha}{2} \left[ \begin{array}{c} V_{ac,1}^2(1 - \cos2\omega_1 t) + V_{ac,2}^2(1 - \cos2\omega_2 t) + \\ 2V_{ac,1}V_{ac,2}(\cos(\omega_1 - \omega_2)t - \cos(\omega_1 + \omega_2)t) \end{array} \right]$$

In the special case that $\omega_1=\omega_2$, $F_{elst}$ only contains the doubled input frequency $2\omega_1$ and a DC voltage. The resonator moves at the same frequencies as $F_{elst}$—that is, $(\omega_1-\omega_2)$ and $(\omega_1+\omega_2)$. As a mixing device, this concept has the advantage is that the force is very nearly proportional to the square of the voltage, resulting in a 'linear' mixing—that is, only the sum and difference frequencies are present.

According to the current invention, there is provided a method of operating a micro-electromechanical system, comprising a resonator; an actuation electrode; and a first detection electrode, to filter and mix a plurality of signals, the method comprising: applying a first alternating voltage signal to the actuation electrode, wherein an actuation force is generated having a frequency bandwidth that is greater than and includes a resonant bandwidth of a mechanical frequency response of the resonator, and wherein a displacement of the resonator is produced which is filtered by the mechanical frequency response and varies a value of an electrical characteristic of the first detection electrode; applying a second alternating voltage signal to the first detection electrode, wherein the second voltage signal is mixed with the varying value to produce a first alternating current signal; and detecting the first alternating current signal at the first detection electrode.

This method enables a MEMS resonator to provide a filtering function followed by a mixing function, in the same device. The first input voltage signal is filtered by the high-Q transfer function of the resonator, acting as a highly selective narrowband filter with a pass-band centred on the resonance frequency. The filtered signal is then mixed with the second input voltage signal at the detector. The mixing operation exploits a non-linearity of the output transducer (detector) in converting the displacement signal of the resonator to an electrical signal. In this way, a single resonator device fulfils a dual purpose. The combined filtering and mixing operation provided according to the method is desirable in many applications in which separate filter and mixer components would otherwise be required.

The method may further comprise applying a third alternating voltage signal to the actuation electrode, wherein the first voltage signal is mixed with the third voltage signal to generate the actuation force.

This enables the resonator to provide a mixing function at the input electrode, a high-Q filtering function and a further mixing function at the output electrode. At both input and output, a non-linear characteristic of the transducer (actuator and detector, respectively) is exploited to provide the mixing function. By also exploiting the highly selective filtering function of the resonator, the method implements three important signal processing functions in a single MEMS element. Since the first and third alternating voltages are mixed at the input of the resonator, the actuation force on the resonator comprises the mixed (sum and difference) frequency components of these two signals. The resonator geometry and construction can be adapted to set the resonant frequency so that the high-Q filter selects either the sum or the difference frequency components (as appropriate to a given application) and suppresses unwanted components.

The device may further comprise a second detection electrode, and the method may further comprise: applying a fourth voltage signal to the second detection electrode; and detecting a second alternating current signal at the second detection electrode.

By applying a fourth voltage signal to an additional detector, the resonator can perform multiple operations on the filtered actuation signal. For example, while the (filtered) mechanical displacement of the resonator is mixed with the second voltage signal at the first output electrode, the same displacement can be measured directly at the second electrode, by applying a DC bias as the fourth voltage signal. This increases the range of operations available in the same resonator device even further.

The fourth voltage signal may be an alternating voltage signal, wherein the fourth voltage signal is mixed with a varying value of an electrical characteristic of the second electrode to produce the second alternating current signal.

When the fourth voltage signal is an AC voltage signal, the additional operation performed by the second detector is a mixing function. Thus, a single narrowband filtered signal (the mechanical displacement) can be mixed independently with two other AC signals, at the first and second detection electrodes, respectively. This provides another useful combination of signal processing functions in a single device.

According to another aspect of the current invention, there is provided a micro-electromechanical system adapted to filter and mix a plurality of signals, the system comprising: a resonator; an actuation electrode to which a first alternating voltage signal is applied, wherein an actuation force is generated having a frequency bandwidth that is greater than and includes a resonant bandwidth of a mechanical frequency response of the resonator and wherein a displacement of the resonator is produced which is filtered by the mechanical frequency response; a first detection electrode having an electrical characteristic a value of which is varied by the displacement of the resonator, to which first detection electrode a second alternating voltage signal is applied, wherein the second voltage signal is mixed with the varying value to produce a first alternating current; and first current detection means for detecting the first alternating current signal at the first detection electrode.

A third alternating voltage signal may be applied to the actuation electrode, wherein the first voltage signal is mixed with the third voltage signal to generate the actuation force.

The system may further comprise a second detection electrode.

A fourth voltage signal may be applied to the second detection electrode and the system may further comprise second current detection means for detecting a second alternating current signal at the second detection electrode.

The fourth voltage signal may be an alternating voltage signal, wherein the fourth voltage signal is mixed with a varying value of an electrical characteristic of the second electrode to produce the second alternating current signal.

The actuation electrode may be one of an electrostatic actuator; or an electrostrictive actuator.

Both these types of actuator provide a precise, stable and uniform non-linear characteristic. This enables an accurate and reliable mixing function in the case that multiple AC voltage signals are applied.

The first detection electrode may be one of: a piezoresistive detector, wherein the electrical characteristic is a resistance; an electrostatic detector, wherein the electrical characteristic is a capacitance; or an electrostrictive detector wherein the electrical characteristic is a capacitance.

Each of these types of detector provides a suitable non-linear transducer characteristic, so as to produce accurate and reliable mixing at the output of the resonator. The piezoresistive detector is particularly interesting, since it offers a 90 degree phase shift compared to the other two types. This increases still further the range of composite functions that can be implemented by the single-resonator device.

At least one of the actuation electrode and the first detection electrode may be a comb-drive electrostatic electrode.

For electrostatic electrodes, it is desirable that the capacitance does not depend on the size of a varying gap between the resonator and the electrode. A comb-drive actuator/detector has interleaved teeth, such that capacitance is varied as the resonator vibrates by changing the area of overlap between the teeth on the electrode and those of the resonator. The gap size (transverse to the direction of motion of the teeth) remains constant. This suppresses unwanted non-linearity and spurious harmonics.

Preferably, one of the first and second detection electrodes is a piezoresistive detector and the other detection electrode is an electrostatic detector; or an electrostrictive detector.

The presence of a piezoresistive detector and an electrostatic or electrostrictive detector on the same resonator offers the possibility of quadrature-phase signals derived from the same reference. This is particularly useful, for example, in the construction of modulators and demodulators for RF communications.

Preferably, the resonator is adapted to resonate in an extensional mode.

Such extensional or "bulk mode" resonance improves the linearity of the filtering operation.

The invention will now be described by way of example with reference to the accompanying drawings, in which.

Figure 1:
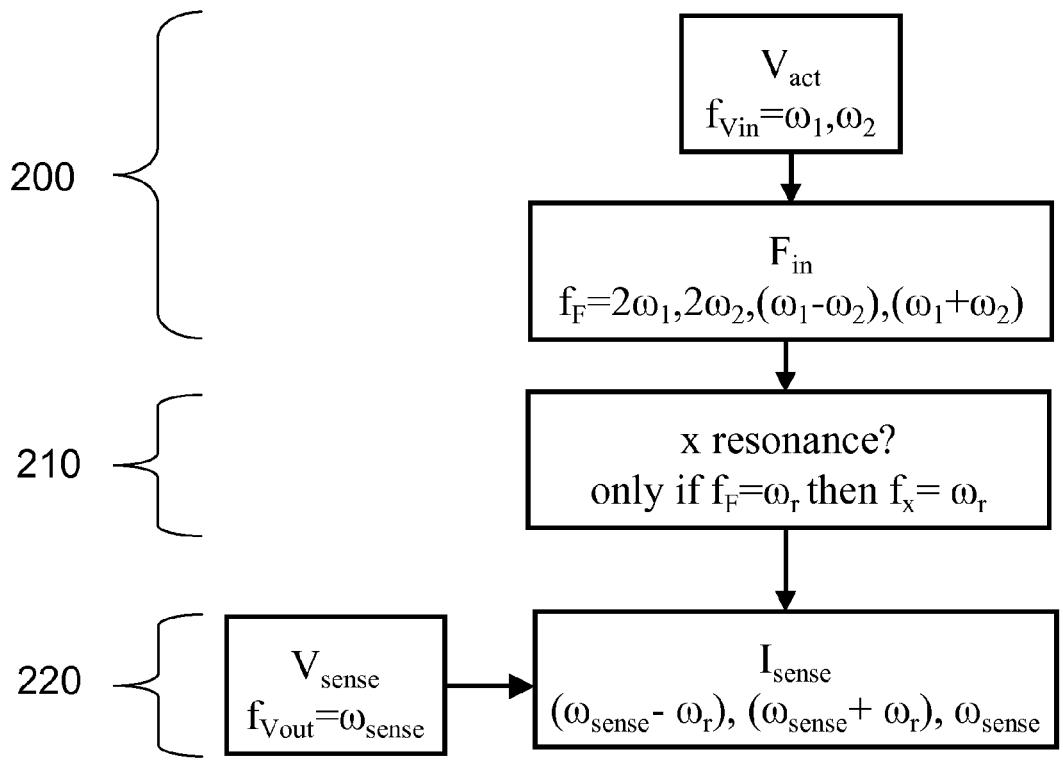
FIG. 1 is a block diagram of the operations performed by the MEMS resonator device according to an embodiment of the invention.

The current inventors have realised that the detector of a MEMS resonator can be designed to mix a signal corresponding to the mechanical displacement of the resonator with a bias voltage at the detection electrode. They have also realised that the combination of this output mixer with the highly selective mechanical filtering potential of the resonator is very useful in the design of many typical RF circuits. Combining the filter and mixer, which would conventionally have been separate components, brings advantages of simplicity, reduced cost and miniaturisation. The characteristics of the MEMS resonator mean that the resulting combined filter+mixer circuit element is of particularly high quality.

Mixing at the output of a MEMS resonator can be achieved with any detector which exhibits a non-linear relationship between mechanical displacement and some electrical characteristics of the electrode. In one embodiment of the current invention, a non-linear relationship between mechanical displacement and current is identified and applied, to provide a detector (output) mixer.

For an electrostatic detector, the non-linear relationship between displacement and current arises because of capacitive effects. If a MEMS resonator is resonating with frequency $\omega_r$, the capacitance of the electrostatic detector is also resonating with frequency $\omega_r$. If a voltage $V_{sense}=V_{ac,sense}\sin\omega_{sense}t$ is applied across this detection capacitor we find:

$$Q = C_{MEMS}V_{sense} = C_0(1+\beta\sin\omega_r t)V_{ac,sense}\sin\omega_{sense}t \quad \text{(Equation 3)}$$

$$Q = C_0 V_{ac,sense}\left(\sin\omega_{sense}t + \frac{\beta}{2}\begin{pmatrix}\cos(\omega_r-\omega_{sense})t - \\ \cos(\omega_r+\omega_{sense})t\end{pmatrix}\right)$$

$$I_{sense} = dQ/dt =$$

$$C_0 V_{ac,sense}\begin{pmatrix}\omega_{sense}\cos\omega_{sense}t - \\ \frac{\beta}{2}\begin{pmatrix}(\omega_r-\omega_{sense})\sin(\omega_r-\omega_{sense})t - \\ (\omega_r+\omega_{sense})\sin(\omega_r+\omega_{sense})t\end{pmatrix}\end{pmatrix}$$

Here, $C_0$ and $\beta$ are constants. The charge on the capacitor (electrode) is the product of the time-varying voltage applied and the time-varying capacitance, producing the mixing effect. The current flowing at the electrode is simply the derivative of charge, so the mixed frequency components are also present in this signal.

Thus when applying an AC voltage with frequency $\omega_{sense}$ across the detection gap of the resonator, the result is output frequencies: $\omega_{sense}$, $\omega_r-\omega_{sense}$ and $\omega_r+\omega_{sense}$. Note that the signal with frequency $\omega_{sense}$ is just the same as would be obtained for a fixed capacitor. Note also that this analysis neglects the effect of $V_{sense}$ on the motion of the resonator. As described above by equation (1), $V_{sense}$ can actuate the resonator as well.

The electrostatic detector is not the only possibility for providing output mixing at the detection electrode of a resonator. Piezoresistive detection of the motion of a MEMS resonator is based on the piezoresistive effect. In this case, the movement of the resonator is detected by measuring the resistance R (or the admittance Y=1/R) of a strain dependent resistor. As for the capacitance of an electrostatic detector, if the resonator is resonating with frequency $\omega_r$, the admittance will also be oscillating at that frequency:

$$Y = Y_0(1+\gamma\sin\omega_r t) \quad \text{(Equation 4)}$$

$$V_{sense} = V_{ac,sense}\sin\omega_{sense}t$$

$$I_{sense} = V_{sense}Y$$

$$I_{sense} = Y_0 V_{ac,sense}\left[\sin\omega_{sense}t + \frac{\gamma}{2}\begin{pmatrix}\cos(\omega_r-\omega_{sense})t - \\ \cos(\omega_r+\omega_{sense})t\end{pmatrix}\right]$$

Here $Y_0$ and $\gamma$ are once again constants. According to equation (4), the current is directly related to the product of the signals to be mixed—namely, the time-varying voltage applied to the electrode and the time varying admittance.

Comparing equations (3) and (4), it can be seen that—except for the absolute value and a phase difference—both piezoresistive and electrostatic detectors perform a similar mixing function.

The analysis above shows how to perform mixing at the output electrode of a MEMS resonator. The analysis below relates to the mechanical filtering function. The mechanical response of a MEMS resonator is similar to a damped mass-spring system. The quality factor Q of the resonator can be very high (>100,000). Therefore it acts as very selective mechanical frequency filter. The position responds to input force according to the following equation:

$$x(\omega) = \frac{F(\omega)/k_{eff}}{(1-\omega^2/\omega_r^2 + j\omega/Q\omega_r)} \quad \text{(Equation 5)}$$

Here, $F(\omega)$ is the frequency dependent force; $k_{eff}$ is the effective elastic modulus of the resonator material; $\omega$ is a component frequency of the force; and $\omega_r$ is the mechanical resonance frequency of the resonator. From equation (5), it is clear that only those components of $F(\omega)$ which have a frequency close to $\omega_r$ will contribute significantly to the motion of the resonator. The Q factor is related to the bandwidth of the pass-band of the resonator frequency response:

$$\frac{\Delta\omega}{\omega_r} = \frac{1}{Q}$$

Here, $\Delta\omega$ is the bandwidth about the natural or resonant frequency $\omega_r$. A high value of Q therefore translates to highly selective filtering of a wide-band actuating force to produce narrow-band mechanical displacement.

FIG. 1 illustrates functions in the frequency domain performed by the MEMS resonator with electrostatic actuation and piezoresistive or electrostatic detection, according to one embodiment of the invention. The electrostatic actuation step 200 involves applying voltage signals $V_{act}$ having two frequencies $\omega_1$ and $\omega_2$ to the input electrode. This gives rise to an actuation force having frequency components at both of the doubled individual input frequencies, as well as their sum and difference (mixed) frequencies. The force on the resonator is filtered at step 210 by the mechanical transfer function of the resonator, acting as a high-Q mechanical filter. Only frequency components of the force at or near the resonance frequency $\omega_r$ are translated into motion of the resonator. Other frequency components, away from the resonant frequency, are suppressed. Step 220 represents the output mixing function. In this stage, a sense voltage $V_{sense}$ having frequency $\omega_{sense}$ is applied to the detection electrode (whether an electrostatic or piezoresistive electrode, as discussed above).

This voltage is mixed with the time-varying electrical characteristic (capacitance or resistance, respectively) which represents the displacement of the resonator. Due to the high-Q filtering function, the resonator will only transfer frequency components at or very near the resonant frequency from the input (force) to the output (as displacement). Thus the output current generated at the detector has frequency components at the sense voltage frequency, and the sum and difference (mixed) frequencies of the sense frequency and resonant frequency.

As described above, mixing is possible at both the input (actuation) and output (detection) electrodes of the resonator. However, in the event that fewer than two mixing operations are desired, the relevant AC voltage signal applied to the electrode can be replaced with a DC bias voltage, as conventionally used to bias a MEMS resonator. Thus the device can implement a "mix-filtermix" function, a "mix-filter" function or a "filter-mix" function.

For example, to achieve the "filter+mix" function, a first alternating (AC) voltage signal (the actuation voltage) is applied to the actuator. Depending on the type of electrode, a DC bias voltage may also be applied. The first voltage signal gives rise to an actuation force having the same frequency components as the signal. These are filtered by the narrow-band mechanical transfer function of the resonator to produce a displacement at and/or near the resonant frequency. The displacement causes a variation in the electrical characteristics of a first detection (output) electrode. To perform the mixing operation, a second alternating voltage signal is applied to the first detection electrode. This is mixed with the measured displacement to produce a first alternating current signal which can be measured or processed further by additional components.

To add a mixing function at the front-end—that is at the input (actuator)—a third alternating voltage signal can be applied to the actuation electrode. This will be mixed with the first alternating voltage signal to produce the actuation force. In this mode of operation, the resonant frequency of the resonator is designed so that it selects the desired mixed frequency component (sum or difference) of the mixed actuation force. This desired frequency component is then transferred to the output as a detected displacement of the resonator (which is mixed with the second voltage signal, as before).

Both electrostatic and piezoresistive detector electrodes have been discussed above. Due to the phase relationship between the signals output by these two types of detector, it useful in many applications to combine the two—that is, to implement two or more diverse detector electrodes in the micro-electromechanical system. Each detector will (if driven by the same alternating voltage signal $V_{sense}$) provide mixed outputs which have a 90 degree relative phase-shift. This can be useful in many modulation and demodulation applications. Another benefit of diversity among detectors is that each type has complementary characteristics. For example, for a feedback signal (in a closed loop configuration), it is essential to have high signal strength; this is offered by piezoresistive detectors. On the contrary, for an output signal, low noise characteristics may be more important; in this case electrostatic detection will usually be more appropriate.

To determine which detection method is more appropriate, one should compare the noise sources and the signal to noise figures. Although electrostatic sensors usually generate lower rms noise voltages, the signal to noise figure of the sensors also depends on the sense voltage or current. In electrostatic sensors the maximum sense voltage is constrained by non-linearities and pull-in of the moving structure. In piezoresistive sensors the sense current is constrained by power dissipation and heating of the sensor. Therefore, although electrostatic detectors tend to have lower noise figures, this strongly depends on the sensor design and available sense voltages and currents.

Of course, the two electrodes will not necessarily be of different types. They may be of the same type—for example, a pair of identical electrodes could be used to mix the displacement signal with two different voltage signals.

When a second detection electrode is provided, a fourth voltage signal ($V_{sense}$) is applied to it. This is mixed with the displacement signal to generate a second alternating current signal at the second detection electrode. If the fourth voltage signal is an alternating (AC) signal, then the current signal will have mixed frequency components at the sum and difference frequencies. If the fourth voltage signal is a DC bias signal, then there is no mixing as such, and the current signal will simply contain the frequency components of the displacement signal.

Figure 2:
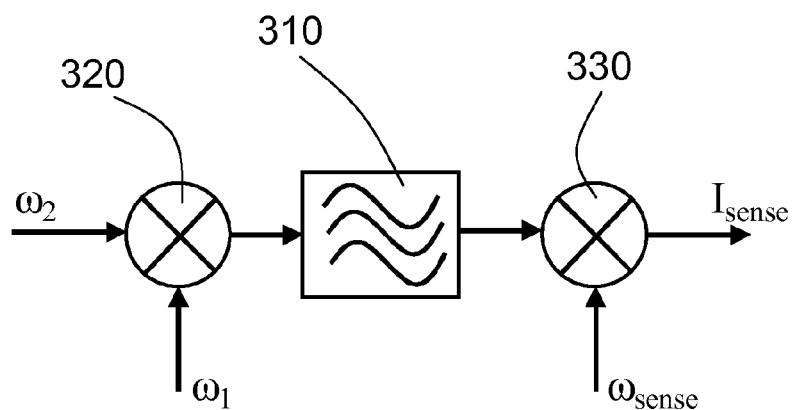
FIG. 2 is a schematic representation of a MEMS filter+mixer utilising electrostatic detection according to another embodiment.

FIG. 2 shows a schematic of an equivalent circuit for the mixing-filteringmixing operation of a resonator according to an embodiment of the invention. The circuit of FIG. 2 corresponds to electrostatic detection. The filtering operation of the resonator is represented by the filter circuit element 310. The input mixer 320 represents the mixing function of voltages at the actuation electrode. Mixing at the electrostatic detection electrode is represented by output mixer 330.

Figure 3:
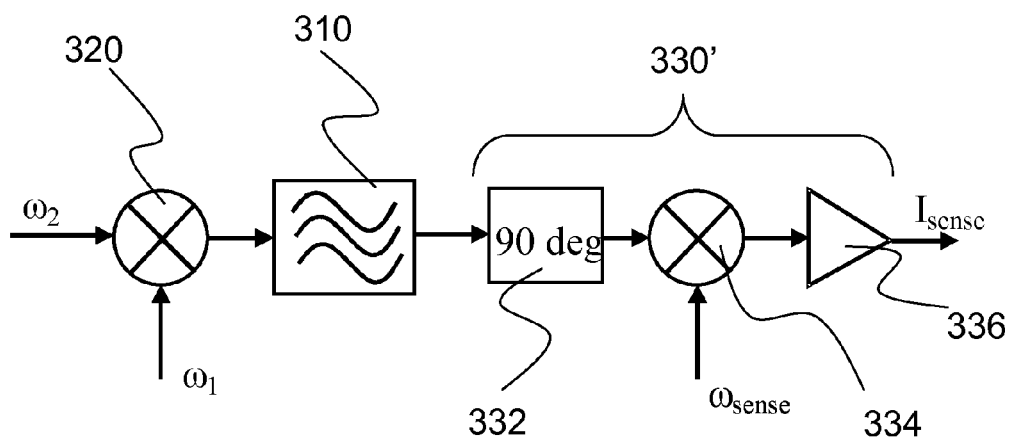
FIG. 3 is a schematic representation of a MEMS filter+mixer utilising piezoresistive detection according to an embodiment.

FIG. 3 shows a schematic of another equivalent circuit corresponding to the case of piezoresistive detection. The filtering operation of the resonator is similar and again represented by the filter circuit element 310. Likewise, the input mixer 320 represents the mixing function of voltages at the actuation electrode. Mixing at the piezoresistive detection electrode is represented by output mixer stage 330'. This output mixer stage comprises a 90-degree phase shifter 332, representing the phase shift relative to the output of an electrostatic detector. It also includes the output mixer 334 and an amplifier 336 representing the amplifying effect of the piezoresistive detector relative to the electrostatic type.

Figure 4:
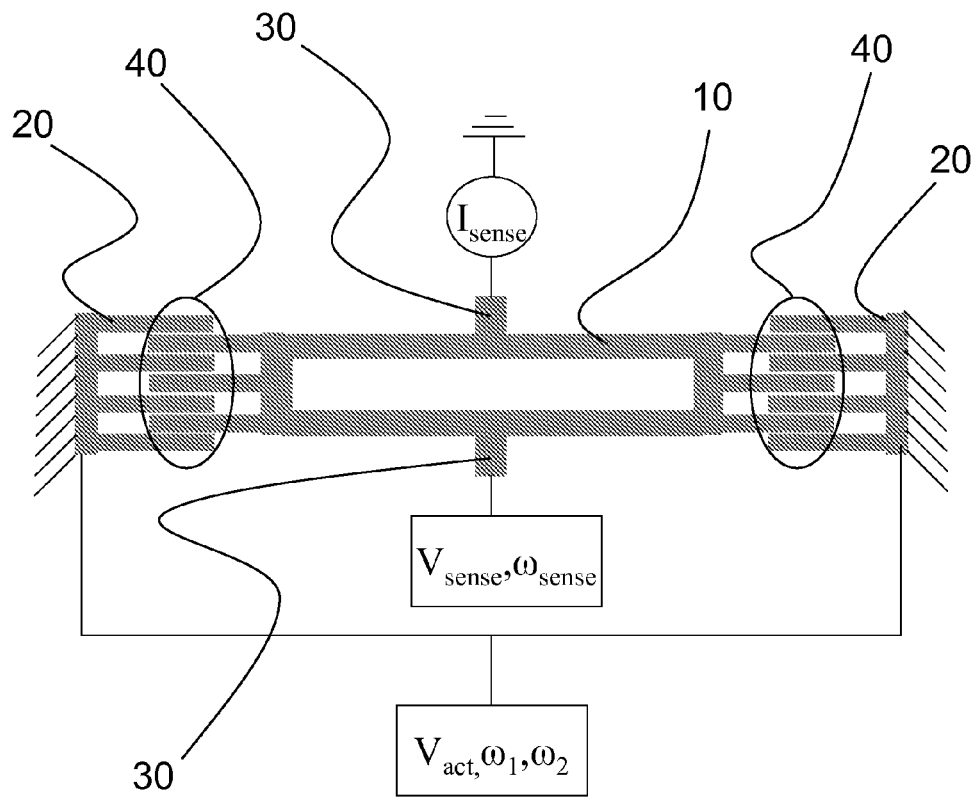
FIG. 4 illustrates a preferred embodiment of a MEMS filter+mixer, using electrostatic actuation by comb-drive electrodes and piezoresistive detection.

FIG. 4 shows a preferred embodiment of a resonator apparatus according to the invention, employing piezoresistive detection. The system comprises a resonator 10 suspended between electrostatic actuation electrodes 20. The piezoresistive detection electrodes 30 are part of the resonator itself. In use, the actuation voltage (first voltage signal) or voltages (first and third voltage signals) are applied to the actuation electrodes 20, the sense voltage (second voltage signal) is applied across the detection electrodes 30 and the output current flowing through the detection electrodes 30 is measured.

To suppress non-linearities and spurious harmonics, it is undesired to have the capacitance depend on the gap-size. Therefore a comb-drive electrostatic actuator is preferred. The comb 40 is formed by a set of teeth on the resonator 10 interleaved with a set of teeth on the actuation electrodes 20. To ensure linearity of the filter device operation, a bulk mode resonance is preferred. In this extensional mode, the resonator expands and contracts, causing the teeth of the resonator 10 in the comb sections 40 to move in and out of the teeth on the electrodes 20. The gap (in the vertical direction, as pictured) between opposing teeth remains constant and so the variation in capacitance is dominated by terms relating to the degree of overlap of the teeth. Note that the gap (in the horizontal direction, as pictured) between the ends of the teeth and the actuation electrode 20 is sufficiently large that it varies negligibly with motion of the resonator.

Figure 5:
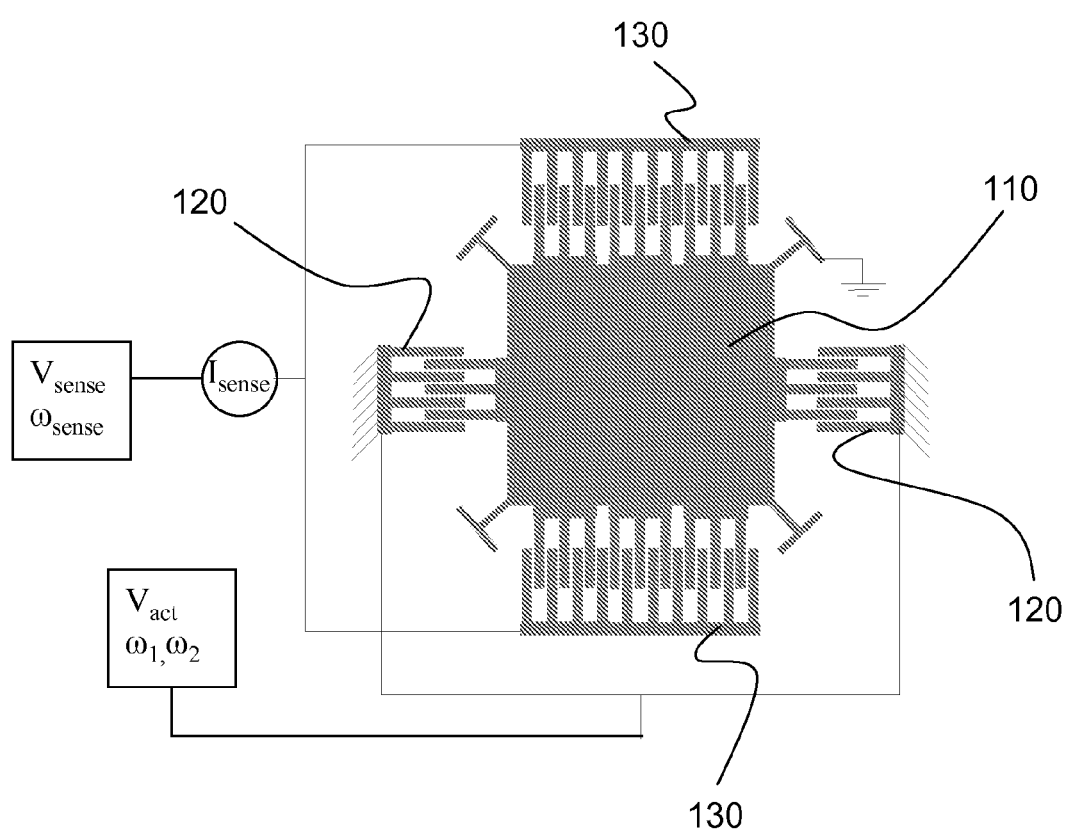
FIG. 5 illustrates a preferred embodiment of a MEMS filter+mixer, using electrostatic actuation and detection by comb-drive electrodes.

FIG. 5 shows a preferred embodiment of a resonator apparatus according to the invention, having electrostatic detection. The resonator 110 is suspended between electrostatic actuation electrodes 120 and electrostatic detection electrodes 130. In use, the actuation voltage(s) are applied to the actuator 120 and the sense voltage is applied to the detector 130. The output current is measured flowing through the detector electrodes 130. Both sets of electrostatic electrodes use the comb-drive, for improved linearity as described above. This device, suspended by its corners, will resonate in a Lame mode or square extensional mode.

Figure 6:
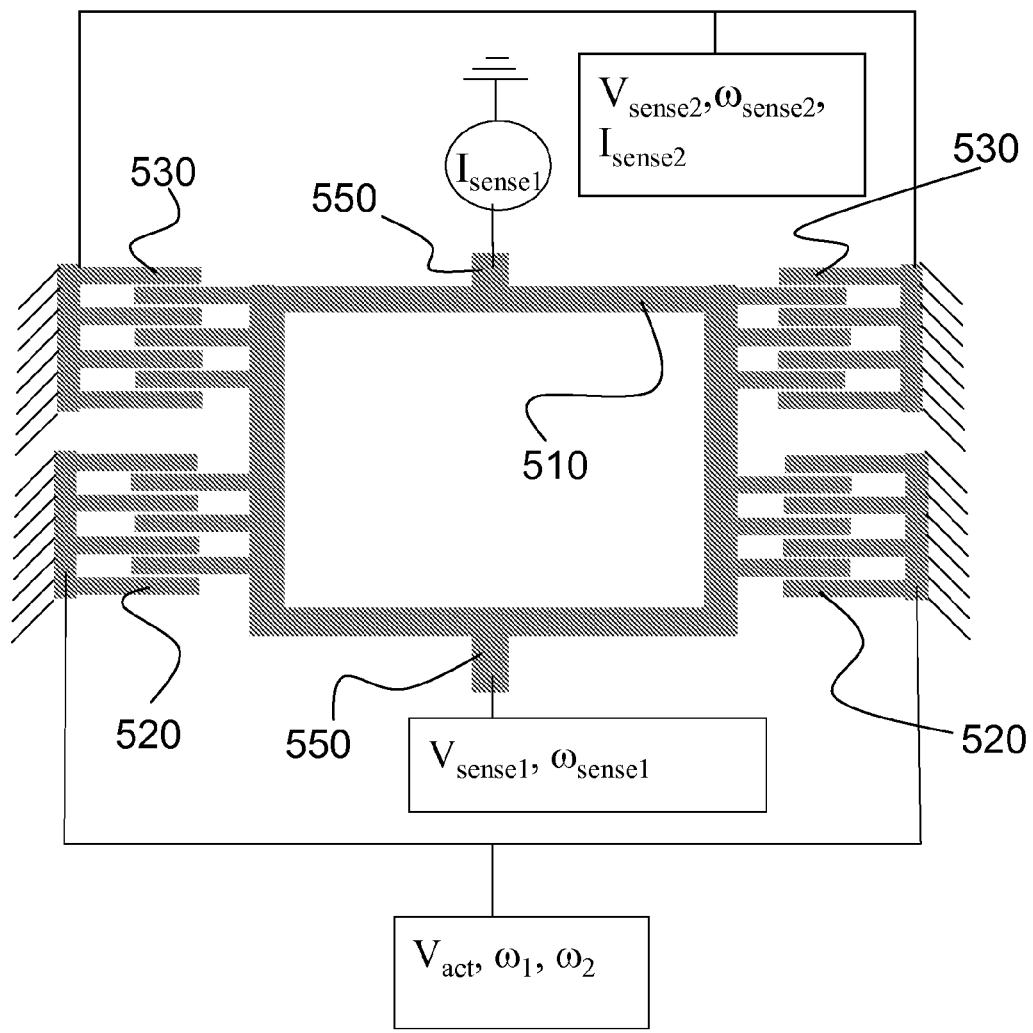
FIG. 6 illustrates a preferred embodiment of a MEMS filter+mixer, including both an electrostatic and a piezoresistive detection electrode.

FIG. 6 shows a preferred embodiment of a resonator apparatus according to the invention, having electrostatic and piezoresistive detection. The resonator 510 is suspended between electrostatic actuation electrodes 520 and electrostatic detection electrodes 550. The piezoresistive detection electrodes 530 are part of the resonator itself. In use, the actuation voltage(s) are applied to the actuator 520 and a first sense voltage (second voltage signal) is applied across the piezoresistive detection electrodes 530. A first output current is measured flowing through the detector electrodes 530. A further sense voltage (fourth voltage signal) is applied to the electrostatic detection electrodes 550 and a second output current flowing through the detection electrodes 550 is measured.

As an alternative to electrostatic transducers, electrostrictive transducers can be used for the actuation or detection method. In these materials the force is also proportional to the square of the actuation voltage, so that these devices have the same equivalent circuit of FIG. 2. Like the electrostatic transducer, the electrostrictive transducer relies on varying capacitance. In fact, an electrostrictive actuator/detector is identical to an electrostatic actuator, except for the fact that the gas/vacuum in the electrostatic actuator is replaced by a compliant material with a certain (preferably high) dielectric constant $\epsilon_r \epsilon_0$ and a certain (preferably low) Young's modulus. The Young's modulus will increase the spring constant of the structure. The dielectric constant will increase the electrostatic force and the capacitance of the actuator/detector by a factor $\epsilon_r$. The rest of the physics of electrostatic actuators/detectors is essentially identical to that of an electrostatic actuator/detector.

As a second alternative, piezoelectric transducers can be used for actuation or detection. In piezoelectric materials, force is linear with voltage and so they do not perform a mixing function. Therefore, if a piezoelectric actuator is used at the input, the input mixer disappears in FIG. 2. If a piezoelectric detector is used at the output, the output mixer disappears.

Note that for a so-called 'linear' mixer (that is, one that does not produce undesired higher order harmonics) it is essential that the spring constant k=dF/dx, which relates stress (force) to strain (proportional extension) of the device is constant. Moreover, force F must be proportional to the square of actuation voltage, $V_{act}^2$, and $I_{sense}$ must be proportional to the product of displacement and sense voltage, $xV_{sense}$. Thus, the linearity of the mixer is limited by the linearity of the material properties of the resonator and by the linearity of the actuation and detection methods employed. Both actuation and detection voltages should preferably be independent of displacement x of the resonator.

Note also that if $V_{sense}$ is too high (when using electrostatic detection) it can affect the force on the resonator which will complicate the device. In a preferred implementation the voltage applied to the output electrode should be much smaller than that applied to the input—that is: $V_{sense} \ll V_{act}$.

The piezoresistive effect does not generate force, and so this problem can be avoided in a well-designed piezoresistive MEMS mixer by making sure that the voltage drop caused by $V_{sense}$ is not occurring near the actuator.

FIGS. 7-13 are examples of a variety of circuits in which the combined filtering and mixing functionality of the invention can be useful. In each of these circuit diagrams, the dashed boxes indicate equivalent components which are implemented by a single resonator device.

Figure 7:
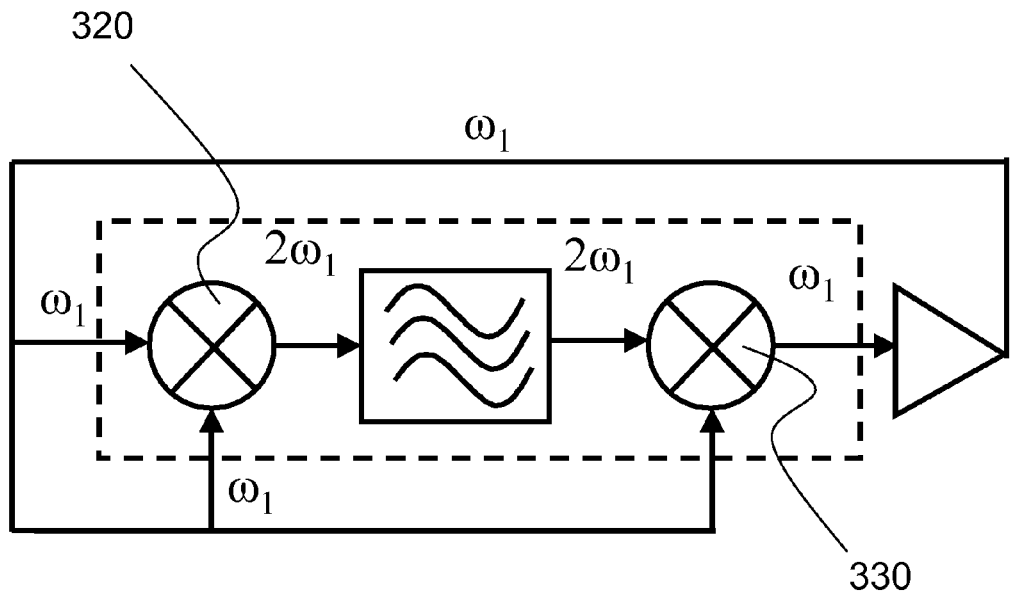
FIG. 7 is an example of an oscillator circuit using a resonator device according to an embodiment of the invention.

FIG. 7 shows an oscillator. This implementation uses electrostatic actuation electrodes to provide input mixer 320 and electrostatic output electrodes to provide output mixer 330. The output of the output mixer 330 is connected, via an amplifier, to each of the inputs. That is, the output of the amplifier is applied to both the actuation and detection electrodes. Unlike a conventional MEMS resonator oscillator circuit, no DC bias voltage is required for the circuit of FIG. 7. The resonator is tuned to a natural frequency $2\omega_1$ which is double the output frequency $\omega_1$ of the oscillator. If an additional 90-degree phase-shifter is added, this circuit can also be implemented using a piezoresistive detector. To suppress the $3\omega_1$ signal produced by the output mixer 330 before the amplifier, a filter may be placed before the amplifier. However, such a filter is not essential since the resonator acts as a filter that will remove all frequencies different from $2\omega_1$.

Figure 8:
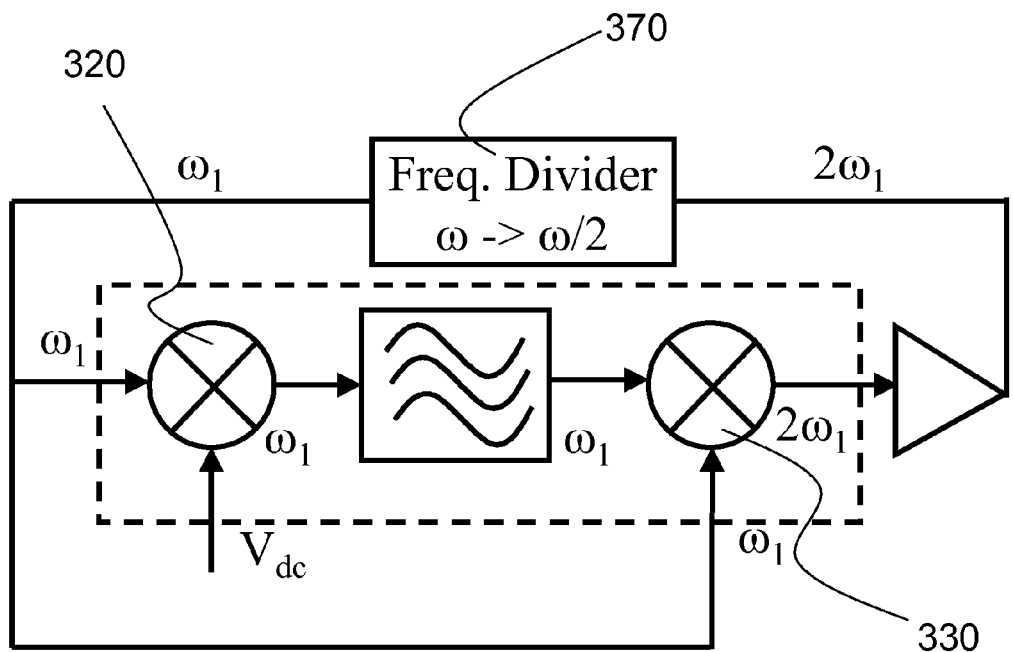
FIG. 8 is another example of an oscillator circuit using a resonator device according to an embodiment of the invention and comprising a frequency divider.

FIG. 8 shows another oscillator, this time made with a frequency divider 370 in the feedback loop. The frequency divider 370 can be a digital frequency divider or a parametric/analog frequency divider. Note that the output frequency of the amplifier (and thus the oscillator) is twice the mechanical resonance frequency of the MEMS resonator. In the circuit of FIG. 8, the input mixer 320 is driven by the output of the frequency divider 370 and by a DC bias voltage. Since the resonator is tuned to the output frequency of the frequency divider, the mixing function of the input mixer 320 is not exploited.

In conventional oscillators, the oscillation starts from noise; however, for the oscillators of FIGS. 7 and 8 the gain is quadratic in the signal level, which might give startup problems. Adapting the discriminator/comparator level of the frequency divider to the average signal level might help to start the oscillation. If necessary these problems can also be overcome by using an 'ignition' pulse to start oscillation.

Figure 9:
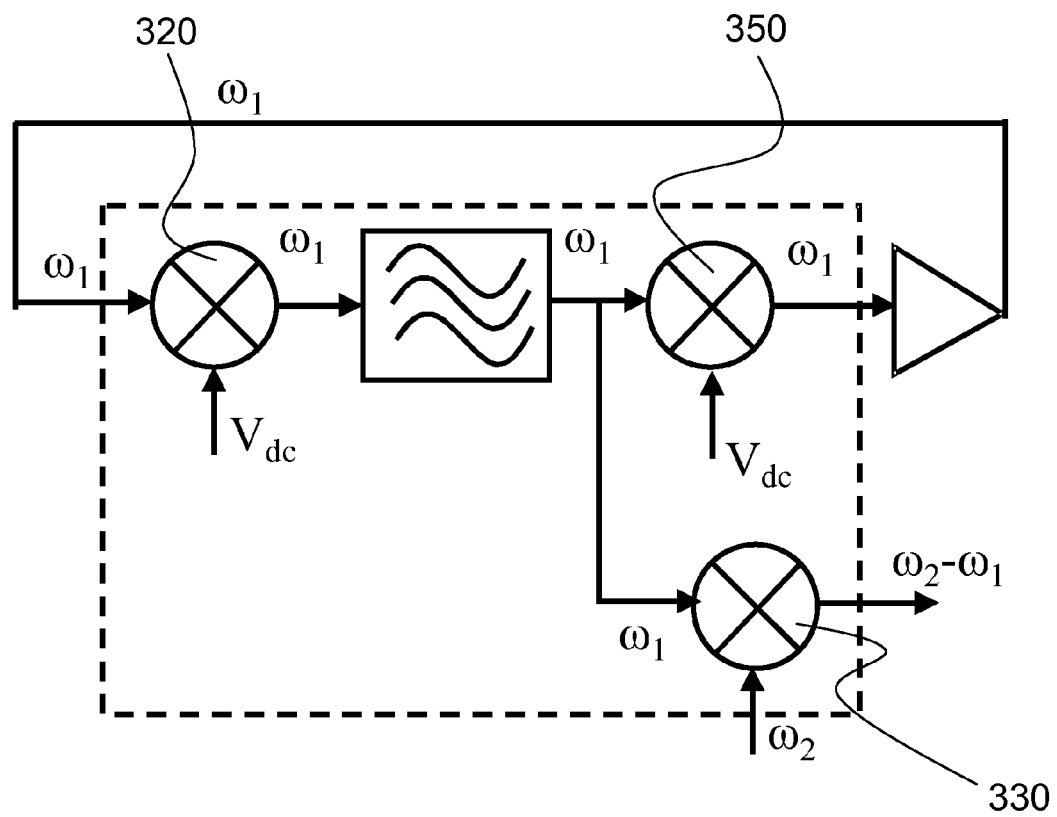
FIG. 9 shows a fixed-frequency local oscillator and mixer circuit using a resonator device with two detectors.

FIG. 9 shows an oscillator+mixer circuit. A first detector provides the first output mixer 330 and a second detector provides the second output mixer 350. The second mixer (detector) is biased with a DC bias voltage, so that no mixing is performed. This second output mixer 350 is being used, together with DC-biased input mixer 320, as a conventional MEMS oscillator. The presence of two detectors enables the same MEMS device to function as both a mixer and an oscillator. In a typical RF communication application, the first output mixer 330 (down-) mixes the known oscillator frequency $\omega_1$ with the "unknown" received frequency $\omega_2$.

Figure 10:
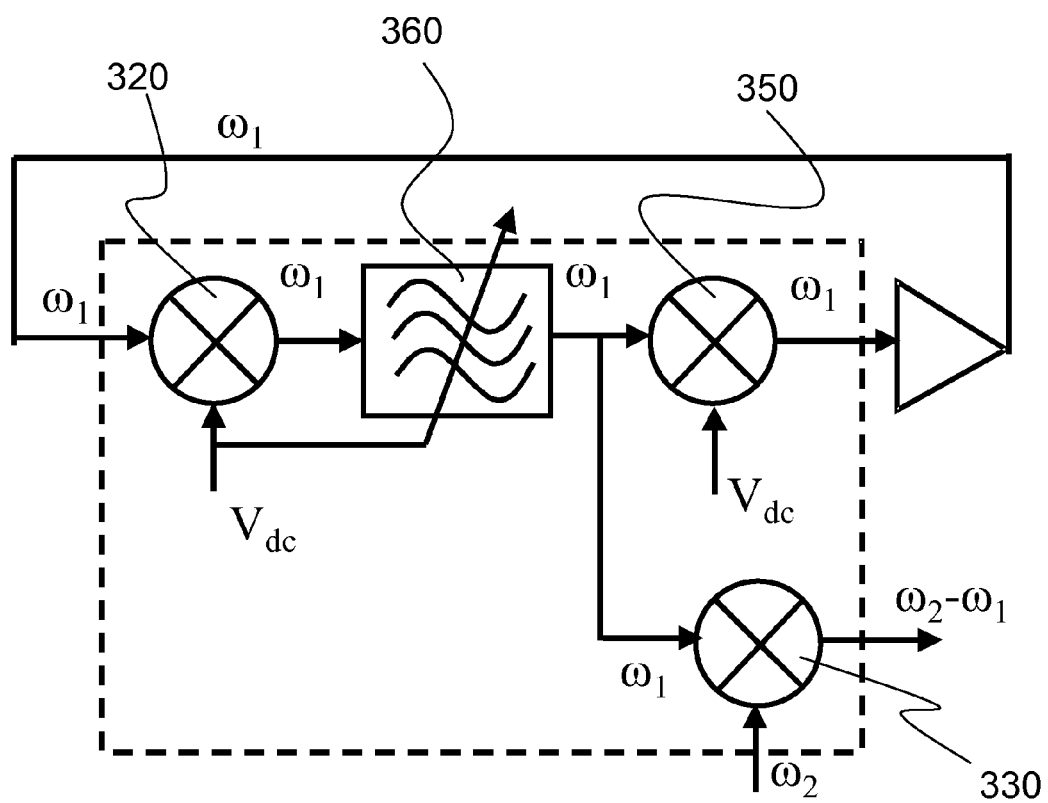
FIG. 10 shows a voltage controlled oscillator (VCO) and mixer circuit using a resonator device with two detectors.

FIG. 10 shows a more advanced oscillator+mixer implementation. In this example, the fixed frequency resonator is replaced with a tunable device 360, which adjusts its natural frequency in response to the applied DC bias voltage. Any electrostatic MEMS resonator can be tuned by a large value of $V_{dc}$ across the actuation gap. Alternatively, the resonance frequency can be tuned by heating the device, which changes the Young's modulus or stress in the device. As a further alternative, the resonance frequency can be tuned by creating a structure which increases its spring constant by bending it using electrostatic or piezoelectric forces. Thus, FIG. 10 provides a voltage controlled oscillator (VCO)+mixer.

Figure 11:
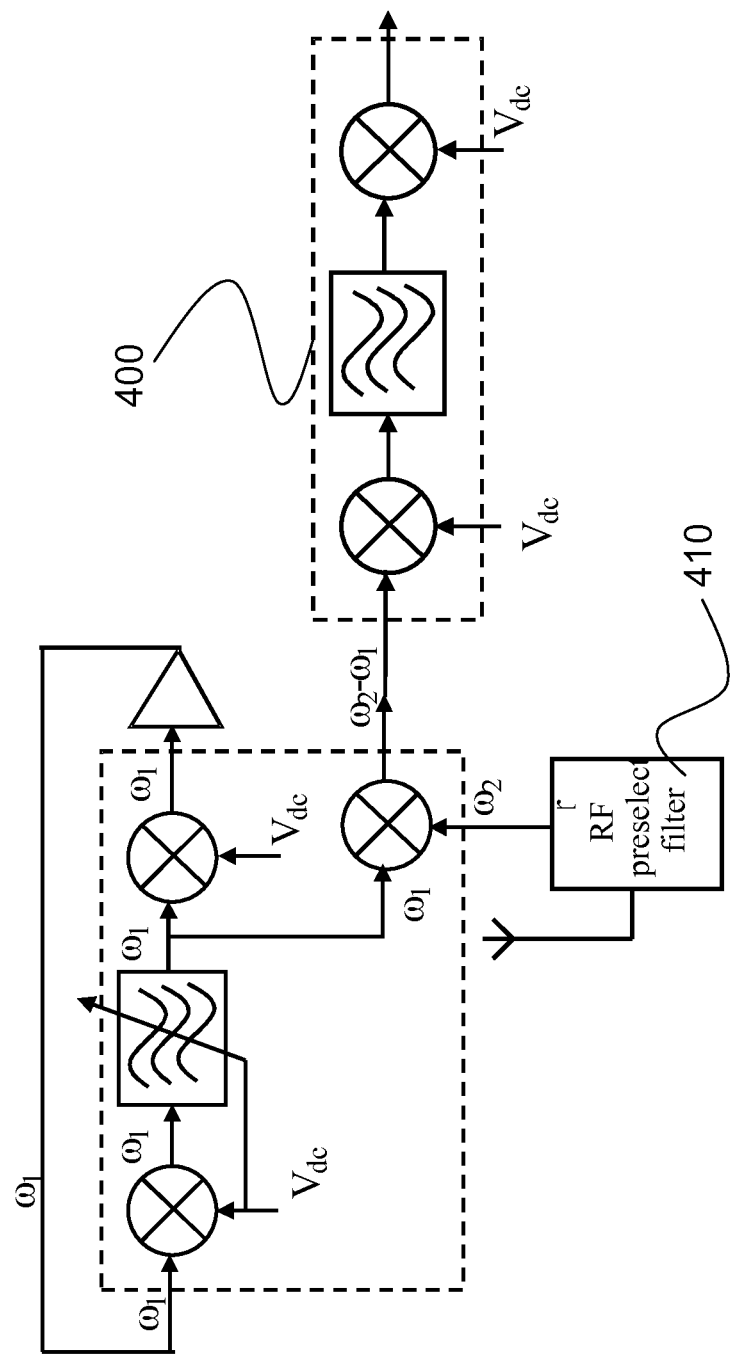
FIG. 11 shows a superheterodyne receiver architecture utilising the VCO and mixer circuit of FIG. 10.

FIG. 11 applies the VCO+mixer circuit of FIG. 10 to build a superheterodyne receiver. As described above in relation to FIG. 9, the received RF signal is applied to the detector electrode of the first output mixer and down-mixed to an intermediate frequency (IF). An RF preselect filter 410 may be provided to reduce the bandwidth of the received signal to the frequencies of interest before mixing. An IF filter 400 at the output of the VCO+mixer circuit can be implemented by a second MEMS resonator device. This is biased at both input and output by a DC bias voltage and so operates in the conventional manner.

Figure 12:
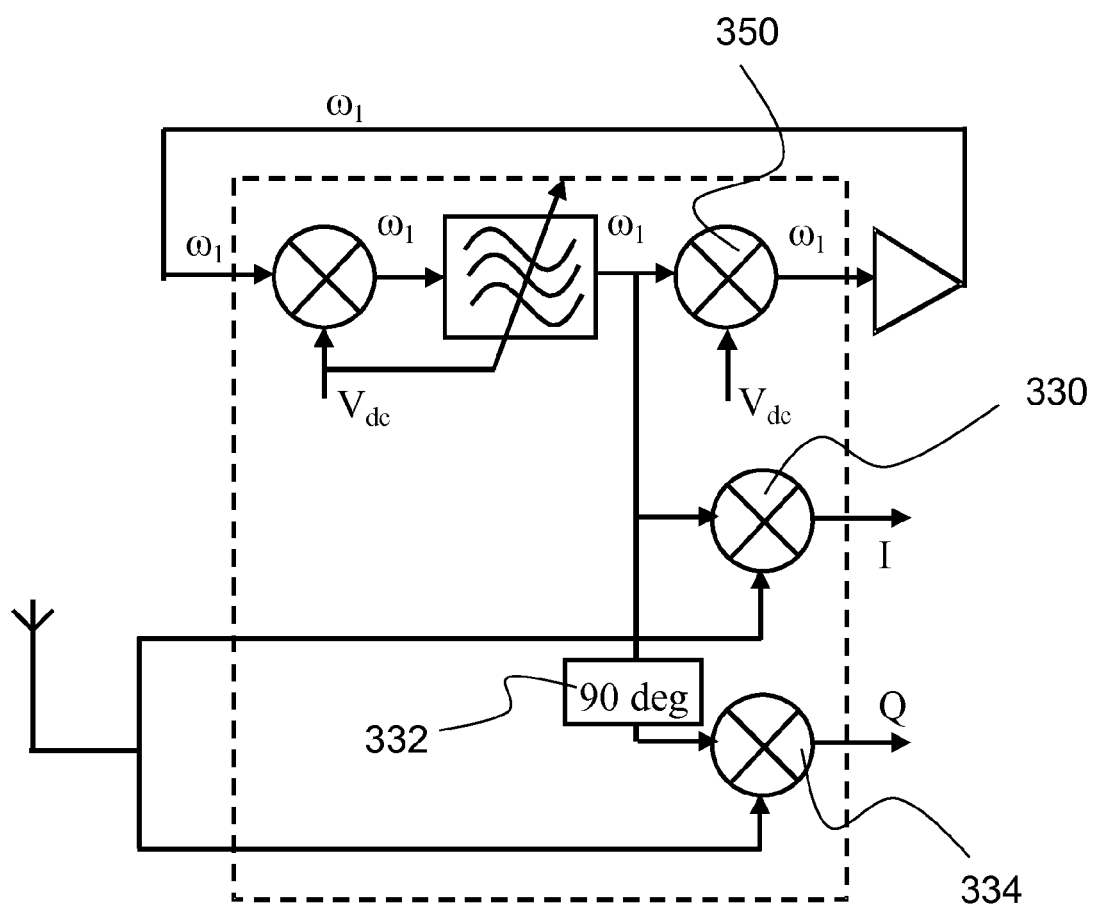
FIG. 12 shows an I-Q demodulator with VCO, using a resonator device with three detectors.

FIG. 12 shows an I-Q demodulator built using a single MEMS resonator. The system has three detection electrodes/mixers and is derived from the VCO+mixer circuit of FIG. 9 above. The first output mixer 330 is an electrostatic detector which demodulates the in-phase "I" component of the quadrature modulated received signal. The second output mixer 350 is DC-biased and forms part of the VCO loop. The third output mixer 334 is a piezoresistive detector and thus has an equivalent circuit incorporating a 90-degree phase-shift block 332. This mixer demodulates the quadrature "Q" component of the quadrature modulated received signal. This circuit illustrates the advantages of combining piezoresistive and electrostatic detectors in a single device.

Figure 13:
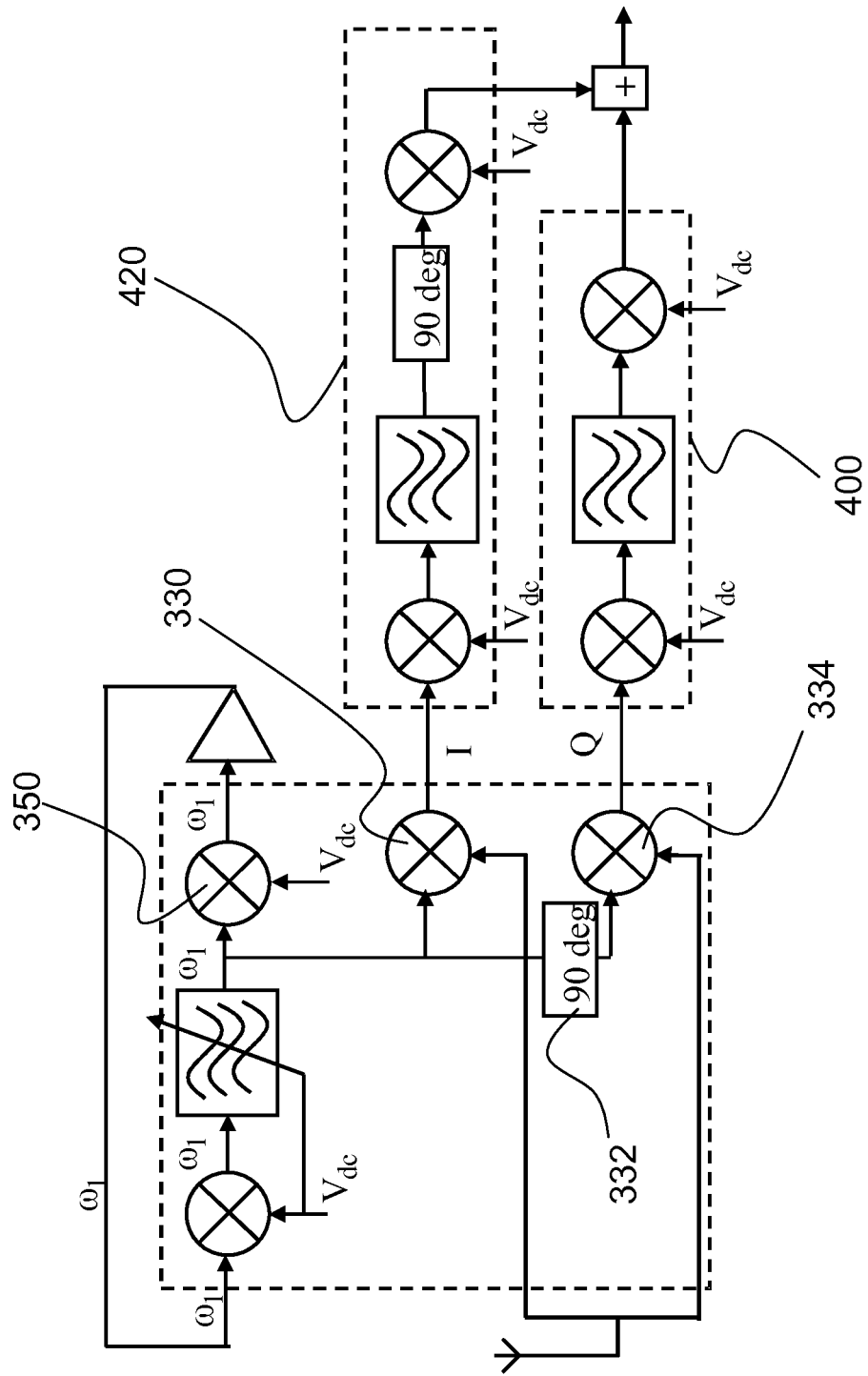
FIG. 13 shows a superheterodyne receiver architecture with an image-reject down-conversion mixer, using a resonator with three detectors.

FIG. 13 shows a superheterodyne receiver architecture with an image-reject down-conversion mixer, using three MEMS resonator devices. The receiver is based on the I-Q demodulator of FIG. 12. Two IF filters, implemented by MEMS resonators are connected to the outputs of the demodulator. The first filter 400 filters the quadrature component and is implemented by a resonator with electrostatic actuator and detector. The resonator is conventionally biased with DC bias voltages at input and output electrodes. The second filter is implemented by a resonator having a piezoresistive detector. This adds another 90-degree phase shift into the in-phase signal path. It is important that both paths have the same gain. This is facilitated by the fact that each has one electrostatic detector and one piezoresistive detector.

The circuits described above have a number of advantages compared to conventional implementations, including: high linearity of the mixers (less harmonics and distortion); high-Q mechanical filtering; the small number of (identical/similar) MEMS devices needed; and small device size. No active/digital/transistor electronics are required, although most of the implementations could benefit from preamplifiers or (digital) control loops.

Various modifications to the methods and apparatus described above will be apparent to those skilled in the art. For example, although many of the circuits described above have been presented in terms of receiver architectures for RF communications applications, similar circuits might be used for frequency synthesis in a transmitter.

Note that the order of steps of the methods described above is not intended to limit the scope of the invention. As will be apparent to the skilled person, the steps may carried out in a different order to that described or concurrently. In particular, the various voltage signals are, in practice, applied to the electrodes at the same time. The detection of current signals at the detection electrodes is also concurrent with the application of the voltage signals.

Reference numerals in the following claims referring to elements in the drawings are not intended to limit the scope of the invention.

The invention claimed is:

1. A method of operating a micro-electromechanical system having a resonator; an actuation electrode; and a first detection electrode, to filter and mix a plurality of signals, the method comprising:
    applying a first alternating voltage signal to the actuation electrode, wherein an actuation force is generated having a frequency bandwidth that is greater than and includes a resonant bandwidth of a mechanical frequency response of the resonator, and wherein a displacement of the resonator is produced which is filtered by the mechanical frequency response and varies a value of an electrical characteristic of the first detection electrode;
    applying a second alternating voltage signal to the first detection electrode, wherein the second voltage signal is mixed with the varying value to produce a first alternating current signal, and wherein the mixing exploits a non-linearity of the first detection electrode in converting the displacement of the resonator to an electrical signal; and
    detecting the first alternating current signal at the first detection electrode.

2. The method of claim 1, further comprising applying a third alternating voltage signal to the actuation electrode, wherein the first voltage signal is mixed with the third voltage signal to generate the actuation force.

3. The method of claim 1, wherein the micro-electromechanical system also includes a second detection electrode, the method further comprising:
    applying a fourth voltage signal to the second detection electrode; and
    detecting a second alternating current signal at the second detection electrode.

4. The method of claim 3, wherein the fourth voltage signal is an alternating voltage signal, wherein the fourth voltage signal is mixed with a varying value of an electrical characteristic of the second electrode to produce the second alternating current signal.

5. The method of claim 1, further including using a second detection electrode for receiving and applying at least one additional voltage signal, wherein one of the first and second detection electrodes is a piezoresistive detector and the other detection electrode is one of an electrostatic detector and an electrostrictive detector.

6. A micro-electromechanical system adapted to filter and mix a plurality of signals, comprising:
    a resonator;
    a first actuation electrode configured and arranged to, in response to application of a first alternating voltage signal, generate an actuation force having a frequency bandwidth that is greater than and includes a resonant bandwidth of a mechanical frequency response of the resonator and produce a corresponding displacement of the resonator, which is filtered by the mechanical frequency response;
    a first detection electrode having an electrical characteristic, the first detection electrode configured and arranged to vary a value of the electrical characteristic in response to the displacement of the resonator relative to the first detection electrode, and in response to application of a, a second alternating voltage signal, mix the second voltage signal with the varying value of the electrical characteristic to produce a first alternating current; and
    a first current detector configured and arranged to detect the first alternating current signal at the first detection electrode.

7. The system of claim 6, wherein the first actuation electrode is further configured and arranged to mix the first voltage signal is mixed with a third alternating voltage signal to generate the actuation force.

8. The system of claim 6 further comprising a second detection electrode.

9. The system of claim 6, wherein the actuation electrode is one of an electrostatic actuator and an electrostrictive actuator.

10. The system of claim 9, wherein at least one of the actuation electrode and the first detection electrode is a comb-drive electrostatic electrode.

11. The system of claim 6, wherein the first detection electrode is one of: a piezoresistive detector, wherein the electrical characteristic is a resistance; an electrostatic detector, wherein the electrical characteristic is a capacitance; and an electrostrictive detector wherein the electrical characteristic is a capacitance.

12. The system of claim 11, further including a second detection electrode, wherein one of the first and second detection electrodes is a piezoresistive detector and the other detection electrode is one of an electrostatic detector and an electrostrictive detector.

13. The system of claim 6, wherein the resonator is adapted to resonate in an extensional mode.

14. The system of claim 6, further including a second detection electrode, wherein one of the first and second detection electrodes is a piezoresistive detector and the other detection electrode is one of an electrostatic detector and an electrostrictive detector.

15. The system of claim 6, further comprising:
a second actuation electrode configured and arranged to, in response to application of a third alternating voltage signal, generate an second actuation force and produce a corresponding displacement of the resonator, which is filtered by the mechanical frequency response; and
a second detection electrode having the electrical characteristic, the second detection electrode configured and arranged to vary a second value of the electrical characteristic in response to the displacement of the resonator relative to the second detection electrode, and in response to application of a fourth alternating voltage signal, mix the fourth alternating voltage signal with the second value of the electrical characteristic to produce a second alternating current.

16. The system of claim 15, wherein the resonator is suspended between the first and second actuation electrodes and the first and second detection electrodes.

17. The system of claim 15, wherein:
the first actuation electrode and the resonator form a first comb-drive electrostatic actuator; and
the second actuation electrode and the resonator form a second comb-drive electrostatic actuator.

18. The system of claim 6, wherein the resonator is coupled and biased to a ground reference voltage terminal of the system.

19. A micro-electromechanical system adapted to filter and mix a plurality of signals, comprising:
a resonator;
an actuation electrode to which a first alternating voltage signal is applied, wherein an actuation force is generated having a frequency bandwidth that is greater than and includes a resonant bandwidth of a mechanical frequency response of the resonator and wherein a displacement of the resonator is produced which is filtered by the mechanical frequency response;
a first detection electrode having an electrical characteristic a value of which is varied by the displacement of the resonator, to which first detection electrode a second alternating voltage signal is applied, wherein the second voltage signal is mixed with the varying value to produce a first alternating current;
a second detection electrode;
a first current detector that detects the first alternating current signal at the first detection electrode, wherein a fourth voltage signal is applied to the second detection electrode; and
a second current detector that detects a second alternating current signal at the second detection electrode.

20. The system of claim 19, wherein the fourth voltage signal is an alternating voltage signal, wherein the fourth voltage signal is mixed with a varying value of an electrical characteristic of the second electrode to produce the second alternating current signal.

* * * * *